US012781390B2

(12) United States Patent
Ishibashi

(10) Patent No.: US 12,781,390 B2
(45) Date of Patent: Nov. 3, 2026

(54) PROCESS FOR MANUFACTURING SINGLE-CRYSTAL FIBER

(71) Applicant: NTT, Inc., Tokyo (JP)

(72) Inventor: Shigeo Ishibashi, Musashino (JP)

(73) Assignee: NTT, Inc., Tokyo (JP)

( * ) Notice: Subject to any disclaimer, the term of this patent is extended or adjusted under 35 U.S.C. 154(b) by 288 days.

(21) Appl. No.: 18/697,981

(22) PCT Filed: Nov. 4, 2021

(86) PCT No.: PCT/JP2021/040670
§ 371 (c)(1),
(2) Date: Apr. 2, 2024

(87) PCT Pub. No.: WO2023/079656
PCT Pub. Date: May 11, 2023

(65) Prior Publication Data

US 2024/0410081 A1 Dec. 12, 2024

(51) Int. Cl.
*C30B 15/22* (2006.01)
*C30B 29/28* (2006.01)
*C30B 29/62* (2006.01)

(52) U.S. Cl.
CPC .............. *C30B 29/62* (2013.01); *C30B 15/22* (2013.01); *C30B 29/28* (2013.01)

(58) Field of Classification Search
CPC .......... C30B 29/62; C30B 15/22; C30B 29/28
See application file for complete search history.

(56) References Cited

U.S. PATENT DOCUMENTS 5,851,284 A * 12/1998 Ishibashi ................. C30B 15/00
117/902

FOREIGN PATENT DOCUMENTS

JP H08-288582 A 11/1996

OTHER PUBLICATIONS

Subhabrata Bera et al., *Dopant Segregation in YAG Single Crystal Fibers Grown by the Laser Heated Pedestal Growth Technique*, Journal of Crystal Growth, vol. 547, 2020, pp. 1-8.
Ken-ichi Shiroki et al., *Effective Segregation Coefficient of Neodymium in Nd: YsALO/\ Single Crystal Growth by Pull-Up Method*, Japan Chemical Society of Japan, No. 7, 1978, pp. 940-944.
A. Sugimoto et al., *Crystal Growth and Optical Characterization of Cr,Ca:* $Y_3Al_5O_{12}$, Journal of Crystal Growth, vol. 140, 1994, pp. 349-354.

(Continued)

*Primary Examiner* — Robert M Kunemund
(74) *Attorney, Agent, or Firm* — Workman Nydegger

(57) ABSTRACT

The present disclosure provides a method for manufacturing a Nd:YAG single crystal fiber exhibiting a radial concentration distribution where the Nd concentration reaches a maximum at a central axis of the single crystal fiber. The method for manufacturing a Nd:YAG single crystal fiber according to the present disclosure involves: preparing a source material having a rod shape and containing a YAG single crystal or polycrystal, Nd, and Ca; melting an end of the source material to form a molten zone; and bringing the molten zone into contact with a seed crystal and pulling up the seed crystal to grow the single crystal fiber.

6 Claims, 7 Drawing Sheets

(56) References Cited

OTHER PUBLICATIONS

S. Ishibashi et al., *Cr, CA:* $Y_3Al_5O_{12}$ *Laser Crystal Grown by the Laser-Heated Pedestal Growth Method*, Journal of Crystal Growth, vol. 183, 1998, pp. 614-621.
Yener Kuru et al., *Enhanced Co-Solubilities of Ca and Si in YAG* ($Y_3Al_5O_{12}$), Physica Status Solidi (c), vol. 5, No. 10, 2008, pp. 3383-3386.
Stuart M. Jacobsen et al., *New Methods for Studying in Optical Properties of Metal Ions in Solids*, The Journal of Physical Chemistry, vol. 96, No. 4, 1992, pp. 1547-1553.

* cited by examiner

PROCESS FOR MANUFACTURING SINGLE-CRYSTAL FIBER

TECHNICAL FIELD

The present disclosure relates to a method for manufacturing a Nd:YAG single crystal fiber.

BACKGROUND ART

Yttrium aluminum garnet (hereinafter referred to as "YAG") is a composite oxide of yttrium (Y) and aluminum (Al) represented by the chemical formula $Y_3Al_5O_{12}$ and is known as a typical laser medium material. Solid-state lasers using neodymium (Nd)-containing YAG (hereinafter referred to as "Nd:YAG") as a laser medium have been widely used in processing and the medical field, and Nd:YAG has been applied to amplifying media of optical amplifiers.

Semiconductor lasers having high conversion efficiency from electricity to light, or laser diodes (hereinafter referred to as "LD"), are often used as excitation light for oscillation of Nd:YAG lasers containing Nd:YAG as a laser medium. In a Nd:YAG laser or the like which uses a single crystal as a laser medium, a method using a single crystal fiber as a laser medium has been developed in order to enhance oscillation efficiency based on LD excitation. A typical high-output LD oscillates in a multiple transverse mode and is said to be poor in converging property. However, using a single crystal fiber having a diameter of 50 to 500 μm as a laser medium makes it possible to achieve a longitudinal waveguide in which excitation light is confined to a cross section of a multimode waveguide. Accordingly, stimulated emission efficiently occurs in the multimode waveguide, whereby the laser using the single crystal as the laser medium is enhanced in oscillation efficiency.

Prime examples of a method for manufacturing a single crystal fiber for a laser include the micro-pulling-down (hereinafter referred to as "μ-PD") technique and the laser heated pedestal growth (hereinafter referred to as "LHPG") technique. The μ-PD technique offers an advantage that a fiber has a roughly even Nd concentration distribution in its cross section but still has a problem of manufacturing only a large-diameter fiber having a diameter of about 500 μm or more. In contrast, the LHPG technique enables manufacturing of a single crystal fiber having a diameter of 50 to 500 μm and is preferable in manufacturing a Nd:YAG single crystal fiber as the aforementioned laser medium.

FIG. 1 is a schematic view illustrating a process for manufacturing a single crystal fiber by the LHPG technique. FIG. 2 is a flowchart illustrating a method 20 for manufacturing a single crystal fiber by the exemplary LHPG technique. The method 20 for manufacturing a single crystal fiber by the exemplary LHPG technique is implemented in an oxygen-containing atmosphere and involves, as illustrated in FIGS. 1 and 2, irradiating a leading end of a source material 11 with a carbon dioxide laser 16 for heating to form a molten zone 12 (corresponding to step 21 in FIG. 2) and bringing the molten zone 12 into contact with a seed crystal 18 and pulling up the seed crystal 18 to grow a single crystal fiber 14 (corresponding to step 22 in FIG. 2) (for example, see Non Patent Literature 4). With regard to the source material 11 used in the method 20 for manufacturing a Nd:YAG single crystal fiber by the LHPG technique, manufacturing methods in the related art have been employing a Nd:YAG single crystal or polycrystal.

For oscillation in a fundamental transverse mode using the aforementioned multimode waveguide as a laser medium, a fiber desirably exhibits a concentration distribution where the concentration of Nd, a luminescence center responsible for the gain, reaches a maximum at a central axis of the fiber in a radial cross section. Similarly, for efficient amplification in an optical amplifier, a fiber desirably exhibits a concentration distribution where the Nd concentration reaches a maximum around an axis of the fiber. However, according to a report in the related art, it is known that a Nd:YAG single crystal fiber manufactured by the LHPG technique exhibits a concentration distribution where the Nd concentration reaches a maximum in a circle equidistant from a central axis of the fiber (see, for example, Non Patent Literature 1).

FIG. 3 is a schematic view illustrating an aspect of the molten zone 12 in a process for manufacturing a Nd:YAG single crystal fiber by the LHPG technique in the related art. In the drawing, convection 13 of a melt in the molten zone 12 is represented by lines with arrows. As described above, in manufacturing a Nd:YAG single crystal fiber by the LHPG technique, the source material 11 employs a Nd:YAG single crystal or polycrystal. According to an existing report, it is known that Nd in a YAG crystal has a segregation coefficient of 0.21, and it is inferred that the molten zone 12 has a Nd concentration of about five times the concentration in the source material 11 (for example, see Non Patent Literature 2). Furthermore, in a Nd:YAG crystal, Nd is known to substitute for a cation site of Y but has an atomic weight about 1.6 times the atomic weight of Y. For this reason, an initially formed melt in the molten zone 12 has a relatively high density, and a newly molten melt in which the Nd content stays unchanged has a density lower than that of the previously formed melt. In other words, the newly molten melt obtains strong buoyancy from the previously formed melt surrounding the newly molten melt, which generates the convection 13 that has a flow coming from the source material 11 of the molten zone 12 toward the grown single crystal fiber 14 around a central axis of the fiber as illustrated in FIG. 3. Due to this phenomenon, Nd atoms are drawn from an area around the top of upper outer convection having the highest Nd concentration, thereby forming an area 15 that exhibits a concentration distribution where the Nd concentration reaches a maximum in a circle equidistant from the central axis of the fiber.

In this manner, a Nd:YAG single crystal fiber manufactured by the LHPG technique exhibits a radial concentration distribution where the Nd concentration reaches a maximum in a circle equidistant from a central axis of the single crystal fiber. Therefore, from the efficiency enhancement point of view in laser oscillators and optical amplifiers using a Nd:YAG single crystal fiber, there is demand for a method for manufacturing a Nd:YAG single crystal fiber exhibiting a radial concentration distribution where the Nd concentration reaches a maximum at a central axis of the single crystal fiber.

CITATION LIST

Non Patent Literature

Non Patent Literature 1: S. Bera et al., "Dopant segregation in YAG single crystal fibers grown by the laser heated pedestal growth technique", Journal of Crystal Growth, 547, P125801, 2020

Non Patent Literature 2: K. Shiroki and Y. Kuwano, "An Effective Neodimium Segregation Coefficient in Neodimium-doped Yttrium-Aluminum-Garnet Crystal Growth by Pulling Method", Journal of The Chemical Society of Japan, 7, P940, 1978

Non Patent Literature 3: A. Sugimoto et al., "Crystal growth and optical characterization of Cr, Ca: $Y_3Al_5O_{12}$, Journal of Crystal Growth", 140, P349-354, 1994

Non Patent Literature 4: S. Ishibashi et al., "Cr, Ca: $Y_3Al_5O_{12}$ laser crystal grown by the laser-heated pedestal growth method", Journal of Crystal Growth, 183, P614-621, 1998

Non Patent Literature 5: Yener Kuru et al., "Enhanced co-solubilities of Ca and Si in YAG ($Y_3Al_5O_{12}$)", Physica Status Solidi (c) 5, P3383-3386, 2008

SUMMARY OF INVENTION

The present disclosure has been made in light of the problem, and an object of the present disclosure is to provide a method for manufacturing a Nd:YAG single crystal fiber exhibiting a radial concentration distribution where the Nd concentration reaches a maximum at a central axis of the single crystal fiber.

To solve the problem, the present disclosure provides a method for manufacturing a single crystal fiber of Nd-containing YAG, the method involving: preparing a source material having a rod shape and containing a YAG single crystal or polycrystal, Nd, and calcium (Ca); melting an end of the source material to form a molten zone; and bringing the molten zone into contact with a seed crystal and pulling up the seed crystal to grow the single crystal fiber.

DESCRIPTION OF EMBODIMENTS

Figure 1:
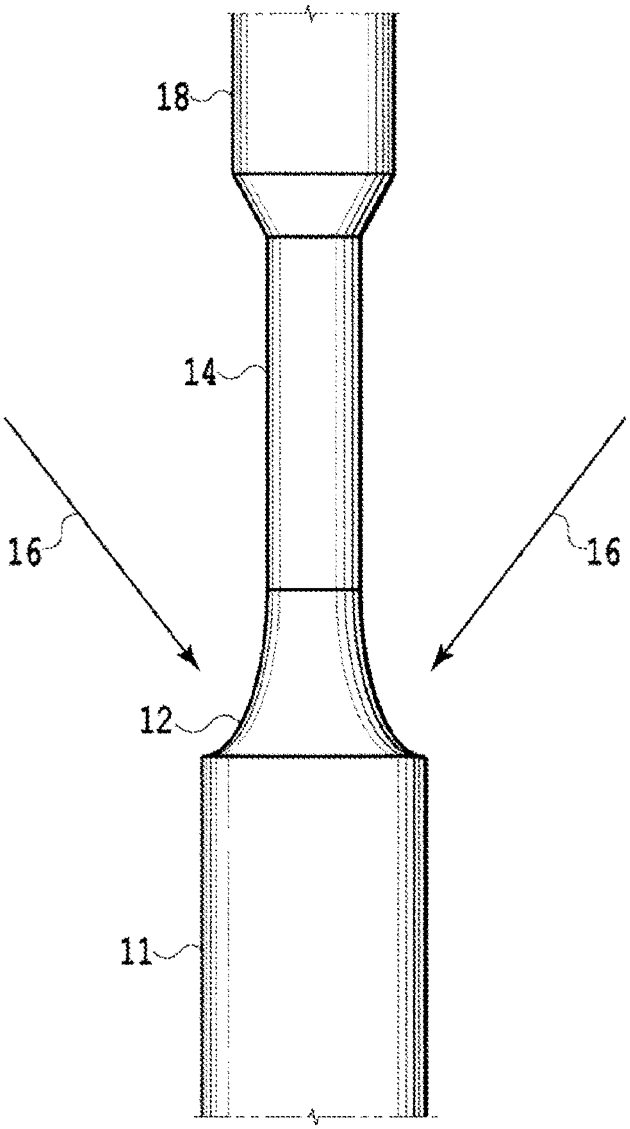
FIG. 1 is a schematic view illustrating a process for manufacturing a single crystal fiber by the LHPG technique.

Hereinafter, various embodiments of the present disclosure will be described in detail with reference to the drawings. The same or similar reference numerals denote the same or similar components, and repetitive explanation thereof may be omitted. The following description is an example, and some configurations may be omitted, modified, or implemented together with additional configurations without departing from the gist of an embodiment of the present disclosure.

Figure 2:
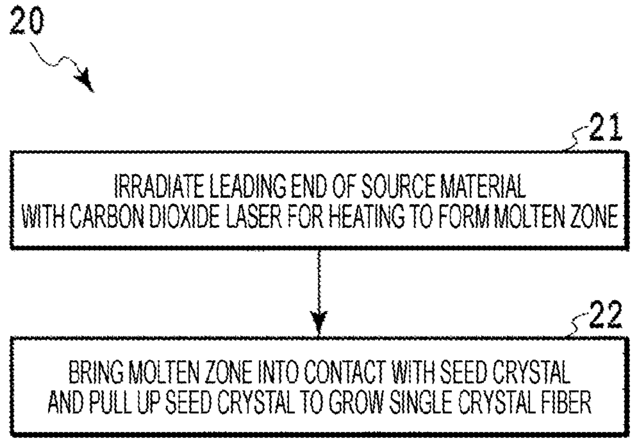
FIG. 2 is a flowchart illustrating a method 20 for manufacturing a single crystal fiber by the exemplary LHPG technique.

A method for manufacturing a Nd:YAG single crystal fiber according to the present disclosure employs the LHPG technique as similar to a method in the related art. However, the method according to the present disclosure differs from the method in the related art in that a separate element from Nd is added to a YAG source material and that a fluid behavior of a melt in a molten zone 12 is changed as illustrated in FIG. 2 so as to form an area 15 having a maximum Nd concentration around a central axis of the fiber.

As described above, a method 20 for manufacturing a Nd:YAG single crystal fiber 14 by the LHPG technique in the related art causes a radial concentration distribution where the Nd concentration reaches a maximum in an area away from a central axis of the single crystal fiber 14 due to a density gradient in the molten zone 12 according to a segregation coefficient of Nd in a YAG crystal. However, adding an additional element having a small segregation coefficient and small atomic weight makes it possible to form a molten zone while a melt is maintained to have a density equal to that of a source material, thereby preventing a density gradient of the melt. In other words, it is possible to manufacture by the LHPG technique a Nd:YAG single crystal fiber that exhibits a radial concentration distribution where the Nd concentration reaches a maximum at a central axis of the single crystal fiber 14.

An example of the additional element satisfying such a condition includes calcium (Ca). Hereinafter, conditions of Ca to be added to Nd:YAG will be described in detail.

Ca-doped Nd:YAG is represented by the chemical formula $Nd_{3x}Ca_{3y}Y_{3(1-x-y)}Al_5O_{12}$ where x represents a ratio of the number of Nd atoms to the number of Y atoms contained in YAG and y represents a ratio of the number of Ca atoms to the number of Y atoms. In the Ca-doped Nd:YAG, atomic weights of the constituent atoms are Y: 88.91, Al: 26.98, 0:16.00, Nd: 144.24, and Ca: 40.08, and a molecular weight S (x, y) of the Ca-doped Nd:YAG is represented by (Formula 1).

[Math. 1]

$$S(x, y) = 165.99x - 146.49y + 593.63 \quad \text{(Formula 1)}$$

A volume change of a YAG melt due to additive elements (Nd and Ca) in YAG is of little significance, and S (x, y) in (Formula 1) is an effective parameter corresponding to the density.

In regard to a segregation coefficient $k_{eff}$, it is known that Nd has a segregation coefficient $k_{eff,Nd}$=0.21, and Ca has a segregation coefficient $k_{eff,Ca}$=0.1 (for example, see Non Patent Literatures 2 and 3). Therefore, the additive elements Nd and Ca in the melt have concentrations of $x/k_{eff,Nd}$=x/0.21 and $y/k_{eff,Ca}$=y/0.1, respectively.

Assume that a Ca-doped Nd:YAG single crystal fiber is being grown (stably grown) by the LHPG technique based on the concentrations. A condition where the density of a newly molten melt becomes equal to or larger than that of a previously formed melt is represented by (Formula 2).

[Math. 2]

$$S\left(\frac{x}{k_{eff,Nd}}\cdot\frac{y}{k_{eff,Ca}}\right)\leq S(x,y) \qquad \text{(Formula 2)}$$

Therefore, when each value is plugged in (Formula 1) and (Formula 2), a condition that causes convection similar to convection of an additive-free melt is represented by (Formula 3).

[Math. 3]

$$y\geq 0.47x \qquad \text{(Formula 3)}$$

However, in a case where YAG is doped with another element (for example, Ca), excessive addition of Ca increases free energy of a YAG crystal system, and a crystal structure cannot be maintained. Furthermore, instead of cation sites of Y, the amount of Ca between lattices increases, which may cause YAG to be amorphous or may cause the added Ca to be phase separated in the state of calcium oxide (CaO). In other words, the method for manufacturing a Nd:YAG single crystal fiber according to the present disclosure places an upper limit on the amount of Ca added to YAG.

In a case where a YAG crystal is doped with Ca, as similar to Nd, Ca substitutes for a Y cation site in YAG, and it is known that adding Ca as Cao in an amount of about 8 at. % makes it possible maintain a structure of the YAG crystal (for example, see Non Patent Literature 5). In CaO doping, it is known to add silicon (Si) to keep electrical neutralization (see, for example, Non Patent Literature 5). In this case, Si substitutes for a Al site, and the same number of Al atoms as the number of Si added is reduced from a raw material. Since Si has an effective ionic radius smaller than that of Al, a segregation coefficient of Si relative to YAG is approximately 1 and have no effect on convection of a melt.

From the above description, a ratio of the number of Ca atoms to be added to YAG to the number of Y atoms (corresponding to y described above) is 0.08 to 1 at a maximum. Taking this upper limit into account in (Formula 3) derives (Formula 4). This (Formula 4) represents a range in amount of Ca to be added in the present disclosure.

[Math. 4]

$$0.08\geq y\geq 0.47x \qquad \text{(Formula 4)}$$

From the above description, manufacturing a Nd:YAG single crystal fiber by the LHPG technique under the condition that satisfies (Formula 4) enables the Nd:YAG single crystal fiber to exhibit a concentration distribution where the Nd concentration reaches a maximum at a central axis.

Figure 3:
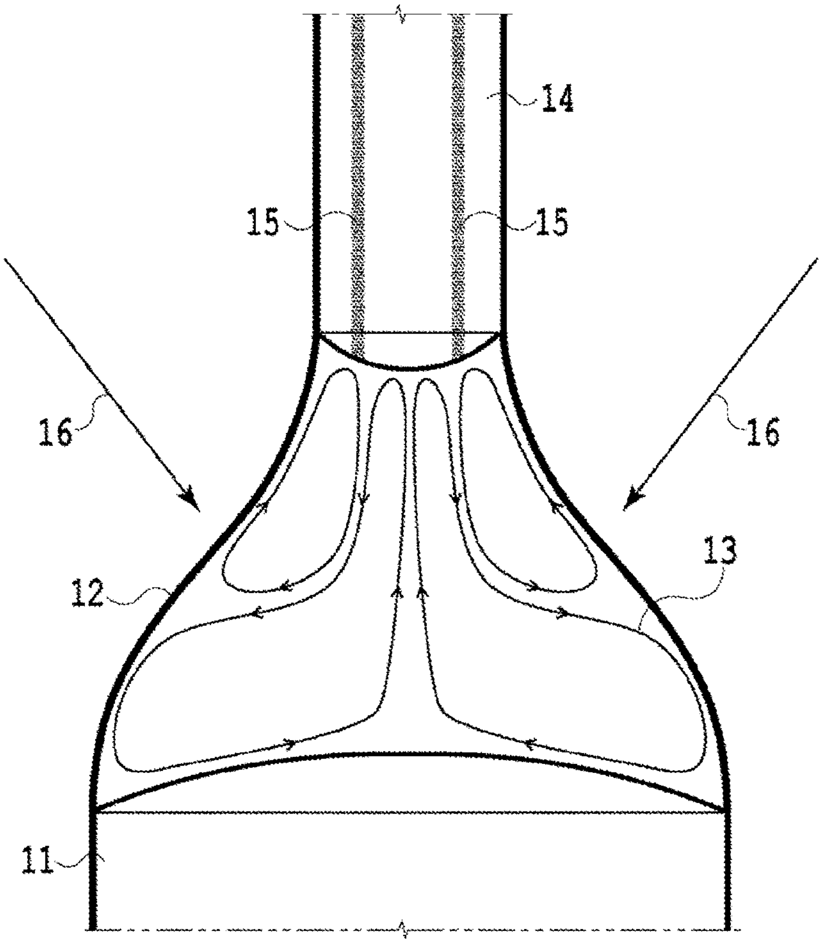
FIG. 3 is a schematic view illustrating an aspect of a molten zone in a process for manufacturing a Nd:YAG single crystal fiber by the LHPG technique in the related art.
Figure 4:
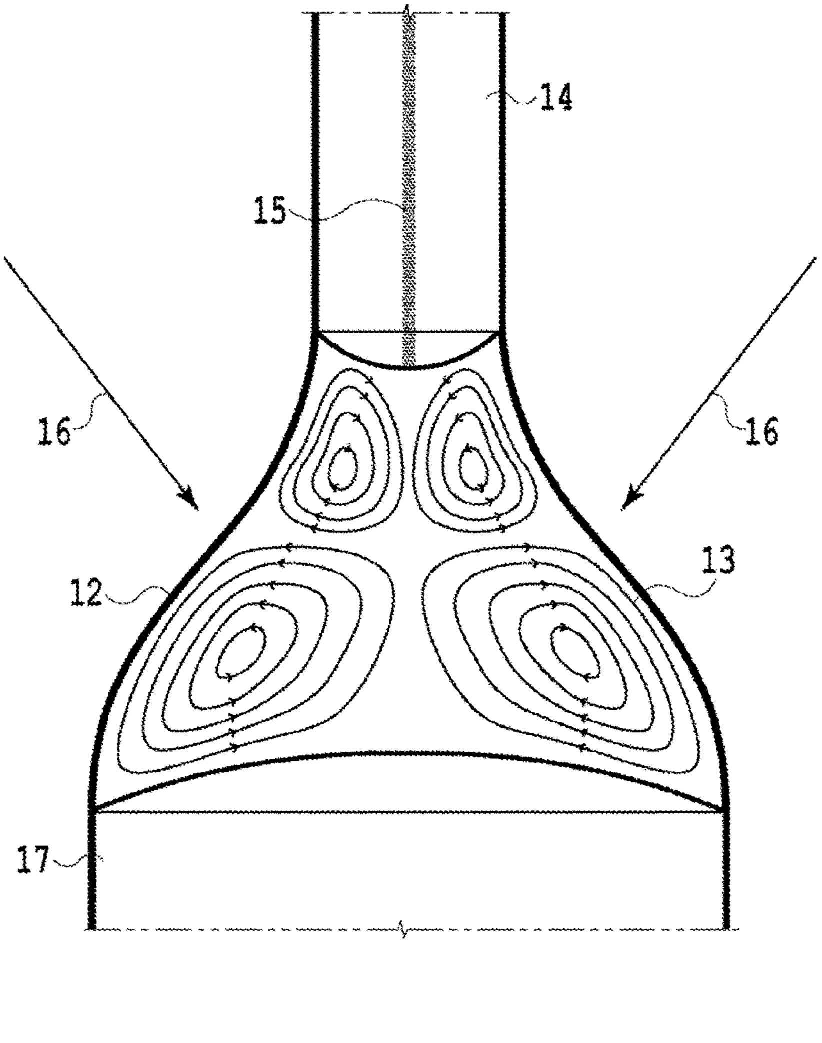
FIG. 4 is a schematic view illustrating an aspect of a molten zone 12 in a process for manufacturing a Nd:YAG single crystal fiber by the LHPG technique according to the present disclosure.

FIG. 4 is a schematic view illustrating an aspect of the molten zone 12 in a process for manufacturing a Nd:YAG single crystal fiber by the LHPG technique according to the present disclosure. Similarly to FIG. 3, in the drawing, convection 13 of a melt in the molten zone 12 is indicated by lines with arrows. Unlike the source material 11 in the related art, a source material 17 in the present disclosure is a YAG single crystal or polycrystal that contains Nd and Ca to satisfy (Formula 4). Based on the above principle, the manufacturing of a Nd:YAG single crystal fiber by the LHPG technique according to the present disclosure does not cause a density gradient of the melt which is attributed to differences in segregation coefficient and atomic weight in the molten zone 12. For this reason, unlike the related art, the convection 13 does not have such a fluid behavior that a fluid flows from the source material 17 of the molten zone 12 toward the grown single crystal fiber 14 around the central axis of the single crystal fiber 14. Accordingly, the Nd concentration reaches a maximum at the central axis of the single crystal fiber 14, that is, a symmetry axis of the convection 13.

In this manner, according to the present disclosure, it is possible to manufacture by the LHPG technique a Nd:YAG single crystal fiber exhibiting a radial concentration distribution where the Nd concentration reaches a maximum at a central axis of the fiber. Accordingly, as compared with a Nd:YAG single crystal fiber manufactured by a technique in the related art, the Nd:YAG single crystal fiber manufactured by the method for manufacturing a Nd:YAG single crystal fiber according to the present disclosure easily achieves oscillation in a fundamental transverse mode and enables a high-efficient laser oscillator and optical amplifier.

Although the method for manufacturing a Nd:YAG single crystal fiber according to the present disclosure employs a source material having a configuration different from one used in the method in the related art, both methods are the same in employing the LHPG technique. Accordingly, there is no need to thoroughly change the existing manufacturing process, which offers an advantage of maintaining an existing production line.

First Embodiment

Hereinafter, a first embodiment of the present disclosure will be described in detail with reference to the drawings. In this embodiment, a source material used in the LHPG technique has a YAG single crystal or polycrystal containing Nd and Ca as additive elements.

Figure 5A:
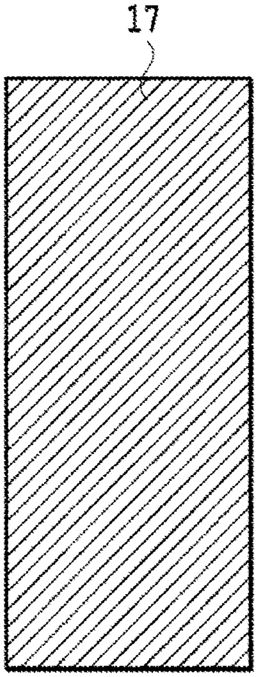
FIG. 5 is a view illustrating a source material used in the LHPG technique according to a first embodiment of the present disclosure in which (a) shows an axial cross-sectional view while (b) shows a radial cross-sectional view.
Figure 5B:
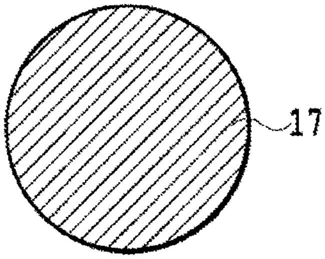

FIG. 5 is a view illustrating a source material 17 used in the LHPG technique according to this embodiment of the present disclosure. FIG. 5(*a*) shows an axial cross-sectional view while FIG. 5(*b*) shows a radial cross-sectional view. The source material 17 according to this embodiment is a rod material having a YAG single crystal or polycrystal as a mother phase and containing Nd and Ca as additive elements inside the mother phase. As described above, the source material 17 contains Nd and Ca to satisfy (Formula 4). On the source material 17 having this configuration, a Nd:YAG single crystal fiber 14 is manufactured by the LHPG technique. As illustrated in the drawing, the source material 17 is desirably a round bar (cylinder) but is not limited in shape as long as the source material 17 has a rod shape.

The source material 17 is prepared by, for example, melting, sintering, element diffusion, ion implantation by ion beams but is not limited in manufacturing method.

Figure 6:
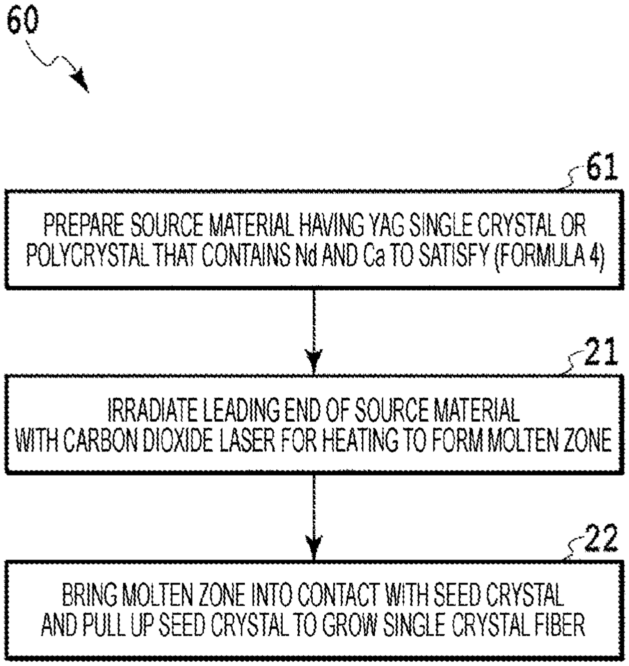
FIG. 6 is a flowchart illustrating a method for manufacturing a single crystal fiber by the LHPG technique according to the present disclosure.

FIG. 6 is a flowchart illustrating a method 60 for manufacturing a single crystal fiber by the LHPG technique according to an embodiment of the present disclosure. Prior to the process of the manufacturing method according to the related art illustrated in FIG. 2, the method 60 for manufacturing a single crystal fiber by the LHPG technique according to the embodiment of the present disclosure further involves preparing a source material having a YAG single crystal or polycrystal that contains Nd and Ca to satisfy (Formula 4) (corresponding to step 61 in FIG. 6). The growth of a Nd:YAG single crystal fiber is typically performed in an oxygen-containing atmosphere, but in the manufacturing method according to the present disclosure, the growth may be performed in an oxygen-free atmosphere.

As described above, in the Nd:YAG single crystal fiber manufactured by this method, the addition of Ca prevents a density gradient of a melt, and a molten zone 12 takes on an aspect as illustrated in FIG. 4. For this reason, the manufactured Nd:YAG single crystal fiber 14 exhibits a concentration distribution where the Nd concentration reaches a maximum at a central axis.

Second Embodiment

Hereinafter, a second embodiment of the present disclosure will be described in detail with reference to the drawings. In this embodiment, a source material used in the LHPG technique has an oxide layer on its outer surface.

Figure 7A:
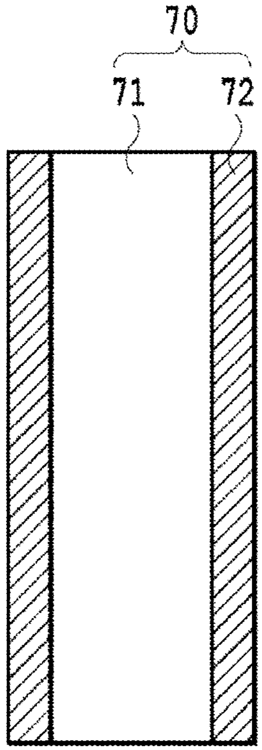
FIG. 7 is a view illustrating a source material used in the LHPG technique according to a second embodiment of the present disclosure in which (a) shows an axial cross-sectional view while (b) shows a radial cross-sectional view.
Figure 7B:
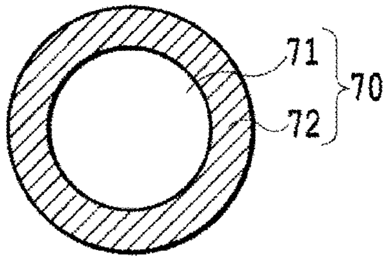

FIG. 7 is a view illustrating a source material 70 used in the LHPG technique according to an embodiment of the present disclosure. FIG. 7(*a*) shows an axial cross-sectional view while FIG. 7(*b*) shows a radial cross-sectional view. The source material 70 in this embodiment includes a base 71 and an oxide layer 72 formed on an outer surface of the base 71. Herein, for example, the base 71 is described as a Nd:YAG single crystal or polycrystal and the oxide layer 72 is described as Cao but may have other configurations as described later. Note that amounts of Nd and Ca are required to satisfy (Formula 4) in the entire source material 70 including both the base 71 and the oxide layer 72.

The oxide layer 72 is formed on the outer surface of the base 71 by, for example, but is not limited to, a physical vapor deposition technique such as vacuum vapor deposition and magnetron sputtering, a chemical vapor deposition technique such as plasma CVD and photo CVD, a liquid phase growth technique such as plating and sol-gel process, a thermal spraying technique such as flame spraying and plasma spraying, or sintering such as hot isostatic pressing and spark plasma sintering.

Manufacturing a Nd:YAG single crystal fiber 14 by the method illustrated in FIG. 6 with the source material 70 according to this embodiment having the above configuration enables the Nd:YAG single crystal fiber 14 to exhibit a concentration distribution where the Nd concentration reaches a maximum at a central axis as similar to the first embodiment.

In this embodiment, for example, the base 71 of the source material 70 employs Nd:YAG and the oxide layer 72 employs Cao, but the materials are not limited to this combination. For example, the base 71 may employ YAG containing Ca as an additive element (Ca:YAG) and the oxide layer 72 may employ neodymium oxide ($Nd_2O_3$). The additive elements (Nd and Ca) of YAG may be contained in either the base 71 or the oxide layer 72.

Alternatively, the oxide layer 72 may be formed on an outer surface of the source material 17 described in the first embodiment, and the resultant may be employed as the source material 70.

However, in any embodiment, amounts of Nd and Ca in the entire source material 70 are required to satisfy (Formula 4) as described above.

INDUSTRIAL APPLICABILITY

Unlike the related art, the method for manufacturing a single crystal fiber according to the present disclosure enables manufacturing of a Nd:YAG single crystal fiber that exhibits a concentration distribution where the Nd concentration reaches a maximum at a central axis. Nd:YAG single crystal fibers having such a concentration distribution easily achieve oscillation in a fundamental transverse mode and are expected to be employed in laser oscillators and optical amplifiers.

The invention claimed is:

1. A method for manufacturing a single crystal fiber of Yttrium Aluminum Garnet (YAG) containing neodymium (Nd), the method comprising:

preparing a source material having a rod shape and containing a YAG single crystal or polycrystal, Nd, and calcium (Ca);

melting an end of the source material to form a molten zone; and bringing the molten zone into contact with a seed crystal and pulling up the seed crystal to grow the single crystal fiber, wherein a second ratio is 0.47 times or more a first ratio and is 0.08 or less, where the first ratio represents a ratio of the number of Nd atoms contained in the source material to the number of yttrium (Y) atoms contained in the YAG single crystal or polycrystal and the second ratio represents a ratio of the number of Ca atoms contained in the source material to the number of Y atoms contained in the YAG single crystal or polycrystal.

2. A method for manufacturing a single crystal fiber of Yttrium Aluminum Garnet (YAG) containing neodymium (Nd), the method comprising:

preparing a source material having a rod shape and containing a YAG single crystal or polycrystal, Nd, and calcium (Ca);

melting an end of the source material to form a molten zone; and bringing the molten zone into contact with a seed crystal and pulling up the seed crystal to grow the single crystal fiber, wherein the source material has a YAG single crystal or polycrystal as a mother phase and contains Nd and Ca inside the mother phase.

3. A method for manufacturing a single crystal fiber of Yttrium Aluminum Garnet (YAG) containing neodymium (Nd), the method comprising:

preparing a source material having a rod shape and containing a YAG single crystal or polycrystal, Nd, and calcium (Ca);

melting an end of the source material to form a molten zone; and bringing the molten zone into contact with a seed crystal and pulling up the seed crystal to grow the single crystal fiber, wherein the source material comprises a base and an oxide layer formed on an outer surface of the base.

4. The method for manufacturing a single crystal fiber according to claim 1, wherein the source material has a YAG single crystal or polycrystal as a mother phase and contains Nd and Ca inside the mother phase.

5. The method for manufacturing a single crystal fiber according to claim 1, wherein the source material comprises a base and an oxide layer formed on an outer surface of the base.

6. The method for manufacturing a single crystal fiber according to claim 2, wherein the source material comprises a base and an oxide layer formed on an outer surface of the base.

* * * * *